United States Patent
Perez

(10) Patent No.: US 11,119,544 B1
(45) Date of Patent: Sep. 14, 2021

(54) MOBILE HARDWARE HEAT DISSIPATING AND PROTECTION DEVICE

(71) Applicant: Ricardo Perez, Marysville, WA (US)

(72) Inventor: Ricardo Perez, Marysville, WA (US)

(*) Notice: Subject to any disclaimer, the term of this patent is extended or adjusted under 35 U.S.C. 154(b) by 0 days.

(21) Appl. No.: 16/812,003

(22) Filed: Mar. 6, 2020

Related U.S. Application Data

(60) Provisional application No. 62/815,062, filed on Mar. 7, 2019.

(51) Int. Cl.
  *G06F 1/20* (2006.01)
  *H05K 7/20* (2006.01)
  *H04B 1/3888* (2015.01)
  *H04B 1/036* (2006.01)

(52) U.S. Cl.
  CPC ......... *G06F 1/203* (2013.01); *H05K 7/20154* (2013.01); *H04B 1/036* (2013.01); *H04B 1/3888* (2013.01); *H05K 7/20409* (2013.01); *H05K 7/20454* (2013.01)

(58) Field of Classification Search
  CPC ............ G06F 1/20; G06F 1/203; H05K 7/20409–20418; H05K 7/20454–20481; H05K 7/20127; H05K 7/20154; H04B 1/3888; H04B 1/036
  See application file for complete search history.

(56) References Cited

U.S. PATENT DOCUMENTS

| | | |
|---|---|---|
| 4,677,654 A | 6/1987 | Lagin et al. |
| 5,818,693 A | 10/1998 | Garner et al. |
| 6,487,073 B2 | 11/2002 | McCullough et al. |
| 7,188,484 B2 | 3/2007 | Kim |
| 8,218,321 B2* | 7/2012 | Foxenland ............ G06F 1/203 361/700 |
| 8,355,248 B2 | 1/2013 | Nishi |
| 9,075,570 B2 | 7/2015 | Yuan |
| 9,127,898 B2 | 9/2015 | Wong |
| 9,176,549 B2 | 11/2015 | Massaro et al. |
| 9,436,239 B1 | 9/2016 | Shannon, III |
| 9,545,030 B2 | 1/2017 | Nikkhoo et al. |
| 9,608,686 B1 | 3/2017 | Coulter |
| 9,720,467 B2 | 8/2017 | Jain et al. |
| 10,615,837 B1* | 4/2020 | Amato ............... H04M 1/0202 |
| 2008/0310108 A1 | 12/2008 | Eriksson et al. |
| 2009/0059481 A1* | 3/2009 | Taylor ................. H05K 7/14 361/679.01 |
| 2010/0219734 A1 | 9/2010 | Lenk |

(Continued)

*Primary Examiner* — Zachary Pape
(74) *Attorney, Agent, or Firm* — John Rizvi; John Rizvi, P.A. —The Patent Professor®

(57) ABSTRACT

A mobile hardware heat dissipating and protection device is disclosed. The device comprises a front layer, back layer, and protective housing into which a mobile device may be installed. The front layer and back layer attach around the mobile device, and are then enclosed by the protective housing. The back layer may comprise a series of heat-dissipating devices, which may include a thermal gel layer and a plurality of heat-dissipating fins. The protective layer may encompass the heat-dissipating fins so as to protect them from damage and contamination, and may create an open space into which air may flow. The protective layer also incorporates a plurality of vents or openings through which the air may flow into the case and over the fins. The device may also incorporate a micro fan to assist with air flow.

15 Claims, 6 Drawing Sheets

(56) References Cited

U.S. PATENT DOCUMENTS

| | | |
|---|---|---|
| 2014/0000844 A1 | 1/2014 | Chandaria |
| 2014/0110083 A1 | 4/2014 | Cheng |
| 2015/0000884 A1* | 1/2015 | Jiang ................. H05K 7/20418 |
| | | 165/185 |
| 2015/0201530 A1* | 7/2015 | Liu ......................... F21V 29/83 |
| | | 455/575.1 |
| 2016/0042202 A1 | 2/2016 | Murray et al. |
| 2016/0205811 A1* | 7/2016 | Wang ..................... G06F 1/203 |
| | | 165/296 |
| 2020/0288833 A1* | 9/2020 | Fathollahi .............. A45C 11/00 |

* cited by examiner

MOBILE HARDWARE HEAT DISSIPATING AND PROTECTION DEVICE

CROSS-REFERENCE TO RELATED APPLICATIONS

This application claims the benefit of U.S. Provisional Patent Application No. 62/815,062, filed on Mar. 7, 2019, which is incorporated herein in its entirety.

FIELD OF THE INVENTION

The present invention relates generally to mobile device cases, and more particularly, to a mobile hardware heat dissipating and protection device.

BACKGROUND OF THE INVENTION

Thermal energy is generated by the movement of subatomic particles within an object or system. Such energy is manifested as heat, and can be generated by the internal properties of an object or by the movement of the object or its components. Such movement, for example, especially as related to the relative motion between components, can generate friction as one objects drags against another and its motion is resisted by the contact between the two components. This friction leads to the conversion of kinetic energy into thermal energy, and the greater amount of friction existing between two objects results in the more rapid generation of heat build-up. While such friction can be used to advantage in certain applications, for example rubbing two sticks together to create a spark or a fire, most machines become less efficient as excess heat is generated and require some means for maintaining internal thermal control.

One solution for achieving such thermal control is a radiator. A radiator is a heat exchanger used to transfer thermal energy, usually through the process of convection, for the purposes of heating or cooling. An in-home radiator, for example, may generate or may receive hot water or steam from a remote heater or boiler, which causes a temperature increase in the radiator itself, and which heat is then transferred into the surrounding air for the purpose of warming the immediate environment. The fins of the radiator, which may be made from copper or, more modernly, aluminum, increase the surface area of the radiator that is exposed to ambient air, thus increasing the transference of heat between the radiator body and the environment.

A cooling radiator, such as that found in an automobile application, operates on similar mechanical and thermodynamic principles, though for a different intended purpose. In vehicles with a water-cooling system, coolant or water is passed through channels in the vehicle's engine block and warmed by the operation of the engine. This heated coolant or water is then routed into the radiator, over which air is passed, by ram air when the vehicle is in motion or by the action of puller or pusher fans when the vehicle is stationary. The heat from the coolant or water is then dissipated by the fins of the radiator into the ambient air, warming the air while cooling the coolant or water to a manageable temperature. This cooled coolant or water is then routed back into the engine block to cool the vehicle's engine during its operation.

In an air-cooling system, on the other hand, such as those used in motorcycles, some cars, and aircraft, the cooling of the system is achieved without the use of coolant or water. Instead, the heat exchanging mechanism is incorporated directly into the heat generator of the system itself. Such incorporation usually comprises the use of heat-transferring materials and buffers, and the use of fins attached to the heat-transferring material to increase the cooling surface area of the system. The fins in such a system are usually placed on an outer surface of the heat generating components, and are preferably placed in the air flow around the system for maximum cooling potential. As with other radiator systems, the flow of air over the fins pulls heat from the system to cool its various components.

Electronic devices also generate significant heat during their operation, especially owning to the transfer of electricity around and through the various solid metal components of the device. The various metals, especially those in the wiring and circuitry of the electronic boards, have unique resistance values that lead to the creation of significant thermal energy. Because excess heat in such electronic devices can cause fatal damage to the circuitry of the device, various methods of cooling are implemented to increase the operational efficiency and longevity of these electronics. Two very common methods of cooling electronic devices involve the installation of a fan to move air over the device, or the installation of a heat sink to transfer heat away from the device and into the ambient air. Both methods employ cooling fins to increase the surface area of the material exposed to the cooling air.

The installation of a fan or a heat sink, while effective in larger electronic devices such as desktop computers or laptops, is a difficult proposition in smaller electronic devices such as cell phones or tablets. The size and space requirements of such cooling solutions are often contraindicated where there is a need for mobile devices to remain small or lightweight. Modernly, though, advances in materials and methods have allowed lighter-weight and smaller-sized cooling solutions to be implemented. In all such solutions, the cooling mechanism is incorporated into a shell or casing that may be attached to the mobile device.

In one such solution, for example, the shell of a cell phone case may comprise a rubberized material, which is a known thermal insulator, and which may serve to retain heat within the system due to the nature of the materials used. The rubberized shell, though, incorporates a number of holes through which heat may be vented or through which air may flow. Such a solution may be effective for cooling a cell phone while the holes are exposed to ambient air, but the location of the holes on the back of the cell phone case necessarily results in them being covered by the hand of a user holding the device. Also, when the cell phone case is placed within a user's pocket or handbag, or when the cell phone is placed on a flat surface and on its back side, no air is flowing over the holes, resulting in a negation of the cooling effect of the holes.

In another such solution, heat-absorbing materials may be integrated into the cell phone case, which is then installed as a standard case on a cell phone. The material may appear in the form of crystals embedded within the case, which liquefy as they are warmed to remove heat from the cell phone itself. Such a solution, though, requires that the case be removed occasionally to permit the crystals to be reset to their solid state, which can be done by allowing the case to sit in ambient temperature for an amount of time or cooling the case under running water. This manifestation results in the case requiring a high level of user effort to maintain the heat-absorbing properties of the cell phone case.

In yet another such solution, the cooling system of the solution is built into a stand or case that may be attached to the cell phone. Such a solution may incorporate fans and a heat sink, but is generally bulkier than a standard cell phone case, and may act more as a stationary dock for a cell phone, by having the cell phone be placed on the solution as opposed to having the solution attached to the cell phone, than a mobile case for the cell phone.

Therefore, there is a need in the art for a mobile hardware heat dissipating and protection device that may remove heat from a mobile device and provide crush and fall damage protection to the mobile device, while maintaining a small form factor and a light weight.

SUMMARY OF THE INVENTION

This summary is provided to introduce a selection of concepts in a simplified form that are further described below in the detailed description. This summary is not intended to identify key features of essential features of the claimed subject matter, nor is it intended to be used to limit the scope of the claimed subject matter. Furthermore, the claimed subject matter is not limited to implementations that solve any or all disadvantages noted in any part of this disclosure.

According to embodiments of the present disclosure, a mobile hardware heat dissipating and protection device is disclosed.

In one aspect, the mobile hardware heat dissipating and protection device may comprise a front cover.

In one aspect, the mobile hardware heat dissipating and protection device may comprise a back cover.

In one aspect, the mobile hardware heat dissipating and protection device may comprise a protective housing.

In one aspect, the mobile hardware heat dissipating and protection device may comprise a screen protector.

In one aspect, the mobile hardware heat dissipating and protection device may comprise a heat-dissipating mechanism.

In one aspect, the mobile hardware heat dissipating and protection device may comprise an integrated heat sink.

In one aspect, the mobile hardware heat dissipating and protection device may comprise a heat-transferring gel layer.

In one aspect, the mobile hardware heat dissipating and protection device may comprise a plurality of fins.

In one aspect, the mobile hardware heat dissipating and protection device may comprise a plurality of vents.

In one aspect, the mobile hardware heat dissipating and protection device may comprise a plurality of phone feature apertures.

In one aspect, the mobile hardware heat dissipating and protection device may comprise an integrated fan.

In one aspect, the mobile hardware heat dissipating and protection device may comprise a soft cell phone case.

In one aspect, the mobile hardware heat dissipating and protection device may comprise a hard cell phone case.

These and other objects, features, and advantages of the present invention will become more readily apparent from the attached drawings and the detailed description of the preferred embodiments or examples, which follow.

BRIEF DESCRIPTION OF THE DRAWINGS

The preferred embodiments and examples of the claimed subject matter will hereinafter be described in conjunction with the appended drawings provided to illustrate and not to limit the scope of the claimed subject matter, where like designations denote like elements, and in which:

It is to be understood that like reference numerals refer to like parts throughout the several views of the drawings.

DETAILED DESCRIPTION

Figure 1:
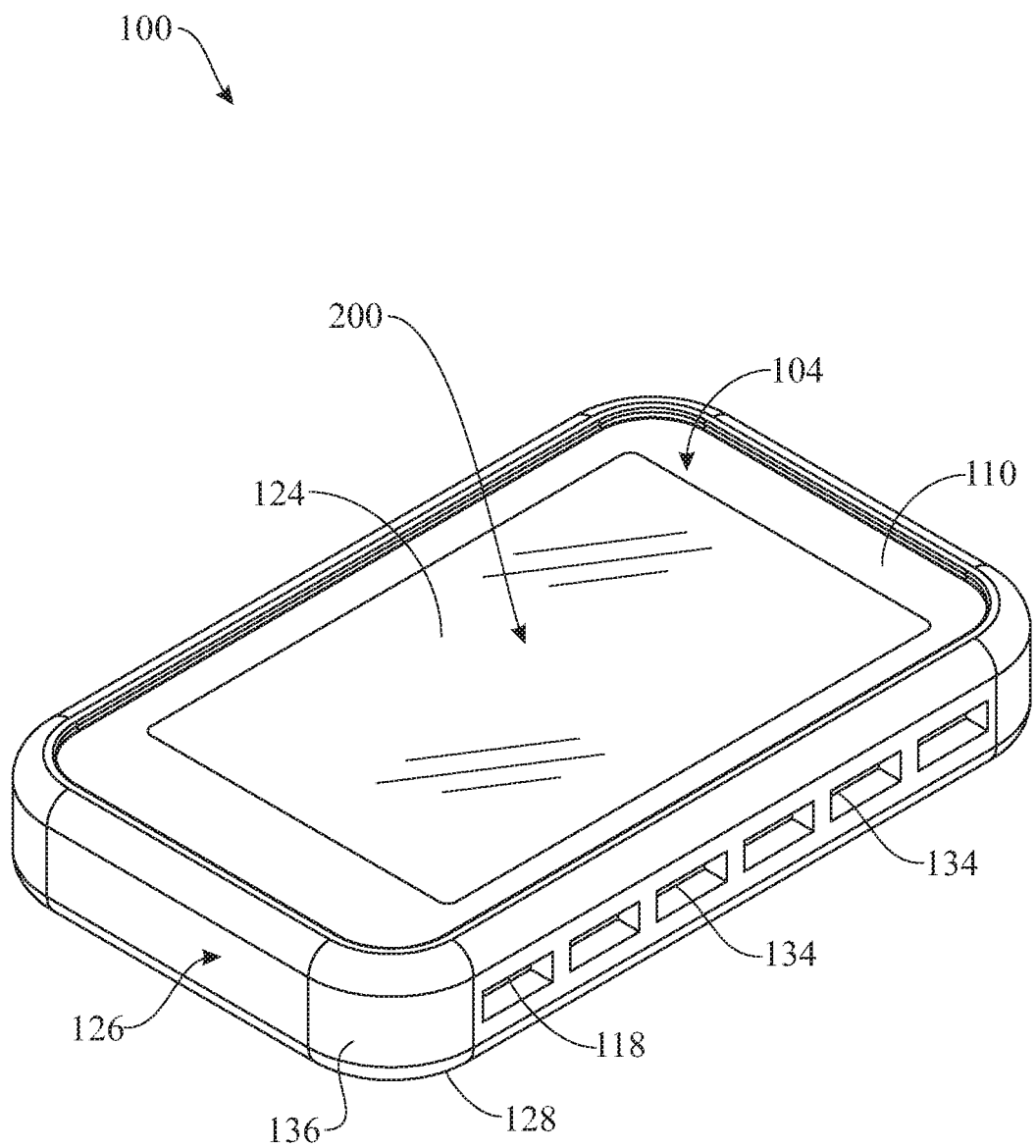
FIG. 1 illustrates a top isometric perspective view of a mobile hardware heat dissipating and protection device, in accordance with aspects of the present disclosure.
Figure 2:
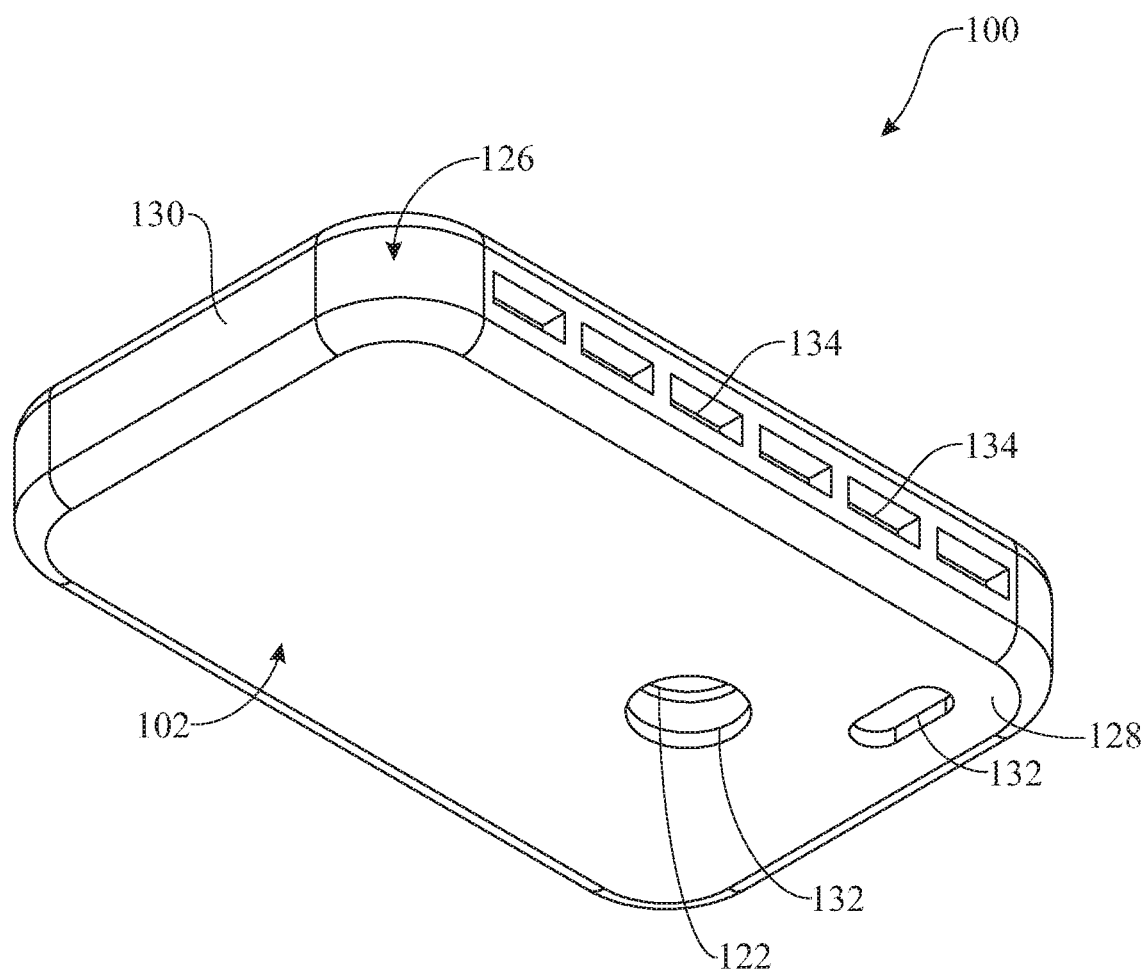
FIG. 2 illustrates a bottom isometric perspective view of a mobile hardware heat dissipating and protection device, in accordance with aspects of the present disclosure.
Figure 3:
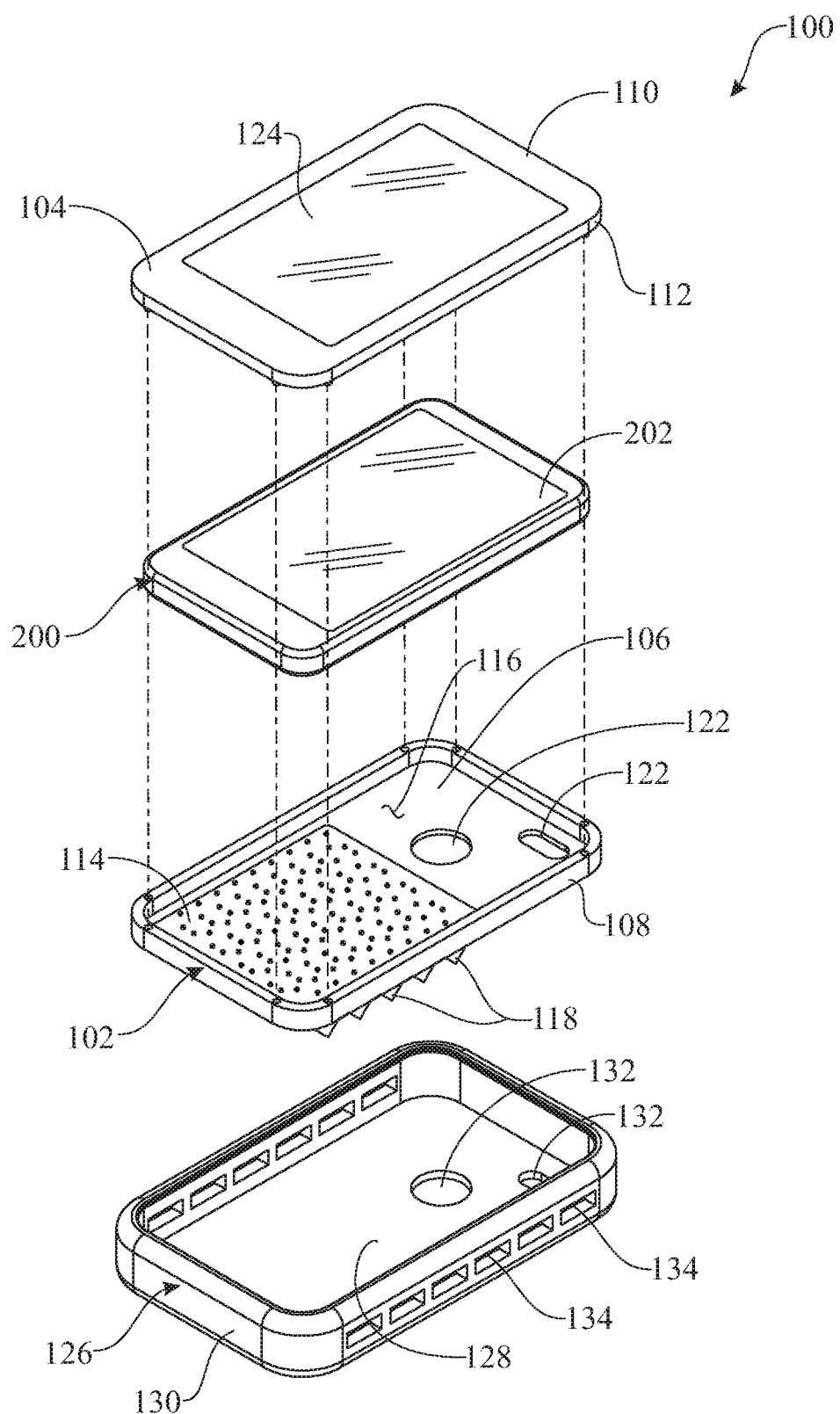
FIG. 3 illustrates a top isometric perspective component view of a mobile hardware heat dissipating and protection device, in accordance with aspects of the present disclosure.
Figure 4:
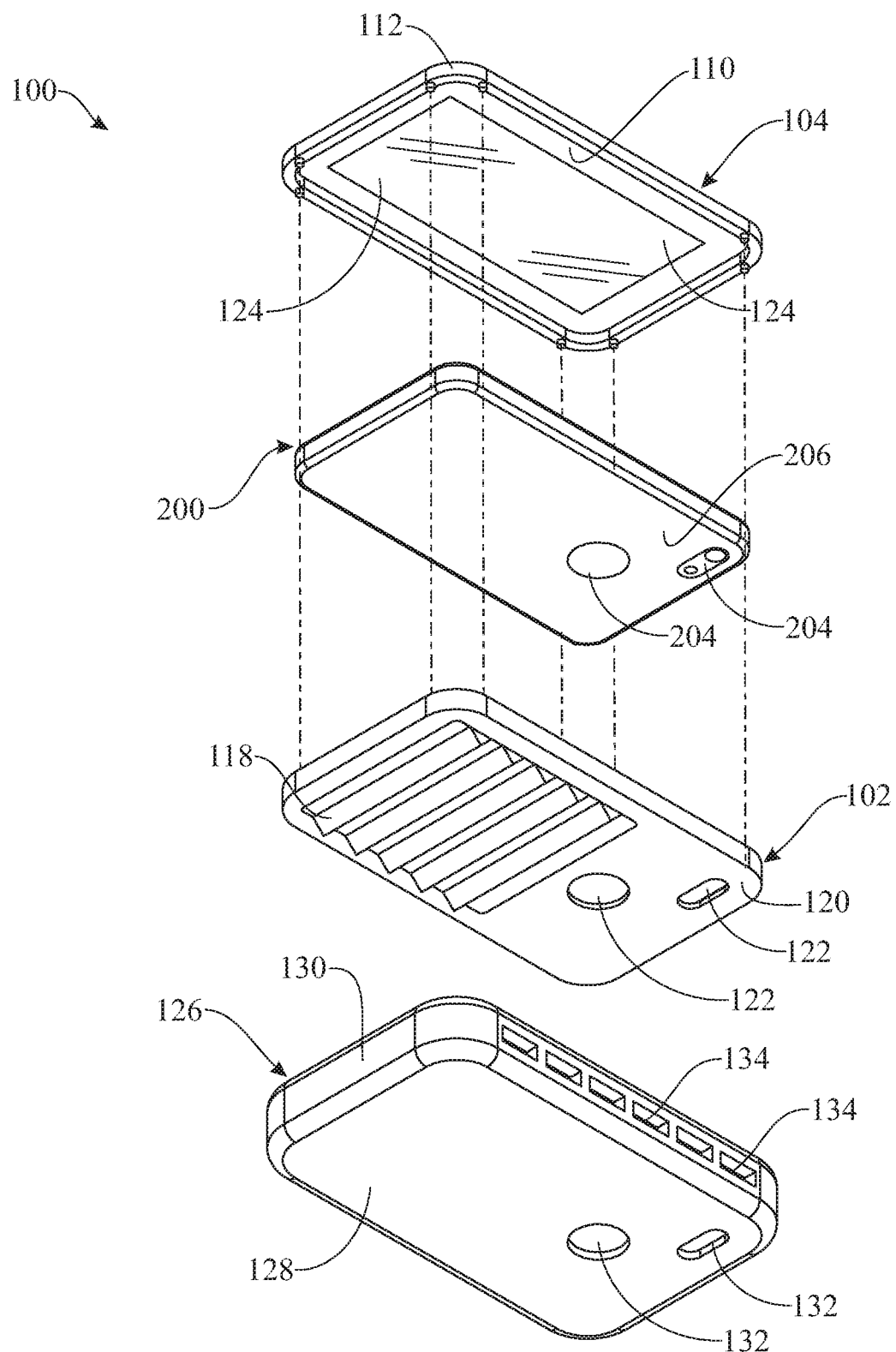
FIG. 4 illustrates a bottom isometric perspective component view of a mobile hardware heat dissipating and protection device, in accordance with aspects of the present disclosure.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. Furthermore, there is no intention to be bound by any expressed or implied theory presented in the preceding technical field, background, brief summary, or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The illustrations of FIGS. 1 through 4 illustrate an overview of a mobile hardware heat dissipating and protection device 100. As contemplated by the present disclosure, the mobile hardware heat dissipating and protection device 100 may generally comprise a back cover 102 and a front cover 104. The back cover 102 may be removably attached to the back surface of a mobile device 200, such as a smart phone or tablet, and may then be removably attached to the front cover 104, which may itself be removably attached to the front surface of a mobile device 200. The attachment of the back cover 102 to the front cover 104 may result in the in the mobile device 200 positioned in-between the back cover 102 and the front cover 104 of the protection device 100. The attachment of the back cover 102 to the front cover 104 may be accomplished by any appropriate means such as, for example, the use of magnets embedded in both covers, the use of clips or pins with one cover having a male connection while the other cover has a female connection, or the abutting of the two covers against each other.

The back cover 102 may comprise, generally, a flat panel 106 having a raised perimeter 108. The shape of the flat panel 106 of the back cover 102 may match the shape of the mobile device 200 intended by the particular embodiment, and the raised perimeter 108 may comprise a shape sufficient to removably attach to the outer perimeter of the mobile device 200. The height of the raised perimeter 108 may be any height less than or equal to the thickness of the mobile device 200.

The front cover 104 may comprise, generally, a flat panel 110 having a raised perimeter 112. The shape of the flat panel of the front cover 104 may match the shape of the mobile device 200, and the shape of the back cover 102, intended by the particular embodiment, and the raised perimeter 112 may comprise a shape sufficient to removably attach to the outer perimeter of the mobile device 200. The height of the raised perimeter 112 may be any height less than or equal to the thickness of the mobile device 200, and may be inversely related to the height of the raised perimeter 108 of the back cover 102 such that the combined heights of the raised perimeters of both covers is equal to or slightly greater than the thickness of the mobile device 200. In this way the back cover 102 and front cover 104, when attached to one another, may tightly encompass the mobile device 200 such that it does not move relative to the covers.

The back cover 102 may further comprise the heat-dissipating mechanism of the system 114. In one embodiment, the back cover 102 may comprise a gel layer, which may include any low resistance layer appropriate for transferring heat between objects. By way of example, though not to be limiting, the gel layer may comprise a thermally-conductive material, which may be any silicone material in the form of a liquid adhesive, paste, gel, potting compound, sheet, roll, pad, or spray. The gel layer may be placed on the inner surface 116 of the back cover 102, or may comprise the entire thickness of an area of the back cover 102, such that it is positioned between the back cover 102 and the mobile device 200 or within the back cover 102 and abutting the mobile device 200. In such an orientation the heat dissipation mechanism 114 may draw heat away from the mobile device 200 by acting as a low-thermal resistance area through which the heat may prefer to travel.

The heat dissipation mechanism 114 may occupy the entire inner surface 116 of the back cover 102 so as to maximize the contact area between the heat dissipation mechanism 114 and the mobile device 200. In some embodiments, especially where the intended mobile device 200 comprises features 204, the heat dissipation mechanism 114 may occupy less than the entire inner surface 116 of the back cover 102 so as to permit access to the features 204 of the mobile device 200.

In another embodiment the heat-dissipating mechanism 114 of the system may comprise a plurality of fins 102, which may be attached to the outer surface 120 of the back cover 102, or may be attached through the back cover 102 such that the plurality of fins 118 are abutting the mobile device 200. The plurality of fins 118 may comprise any appropriate low resistance material of construction so as to permit the transference of heat from the mobile device 200 into the plurality of fins 118, where the flow of air over the plurality of fins 118 may permit their cooling and, thus, the cooling of the mobile device 200. In another exemplary embodiment, a logo may be imprinted, laser etched, or otherwise disposed on the outer surface 120 of the back cover 102. While the imprinted logo may serve to provide an aesthetic look to the protective devise, the imprinted logo will provide a functional feature. For instance, the logo may form micro fins on the outer surface 120 of the back cover 102 that help with heat dissipation.

In another embodiment the heat-dissipating mechanism 114 of the system may comprise both the gel layer—in one exemplary form—and the plurality of fins 118 for improved cooling efficiency. In such an embodiment the plurality of fins 118 may be attached to or within the outer surface of the back cover 102, and the gel layer may be attached to or within the inner surface 116 of the back cover 102. In such an orientation heat from the mobile device 200 may transfer through the low resistance area of the gel layer directly into the low resistance material of the plurality of fins 118 for cooling.

The back cover 102 may further comprise a plurality of back cover openings 122 that may match to the features 204 of the intended mobile device 200 of the particular embodiment. By way of example, a mobile device 200 may comprise a cell phone having a camera and fingerprint reader on its back surface, neither of which a user of the cell phone would want blocked by the case on the cell phone. The plurality of back cover openings 122, then, would comprise openings sufficient to allow a user access to these features 204 on the device.

The front cover 104 may further comprise a screen protector 124 to permit a user to view and protect the screen 202 of the intended mobile device 200 of the particular embodiment. The screen protector 124 may vary as appropriate, though may comprise any suitable screen protector known in the art. By way of example, the screen protector 124 may comprise a thin and flexible screen protector, a thick and solid screen protector, an anti-glare screen protector, an anti-fingerprint screen protector, or any combination thereof. The length and width of the screen protector 124 may be any appropriate length and width, though may be suitable to permit the maximum viewing area of the screen 202 of the intended mobile device 200 of the particular embodiment. The screen protector 124 may further comprise a capacitive surface, so as to permit the touch screen interaction of the screen 202 by the user of the mobile device 200.

The mobile hardware heat dissipating and protection device 100 may further comprise a protective housing 126, which may be removably attached to the outer surface of the back cover 102 and front cover 104 when installed on a mobile device 200, such as a smart phone or tablet. The attachment of the protective housing 126 to the back cover 102 and the front cover 104 may result in the enveloping of the two covers and the mobile device 200 by the protective housing 126. The plurality of fins 118, projecting out from the back cover 102, may also be enveloped by the protective housing 126. The attachment of the protective housing 126 to the back cover 102 and the front cover 104 may be by any appropriate means such as, for example, the use of magnets embedded in the housing and both covers, the use of clips or pins between the housing and both covers, or the stretching of the housing around the outer surface of both covers.

The protective housing 126 may comprise, generally, a flat panel 128 having a raised perimeter 130. The shape of the flat panel 128 of the protective housing 126 may match the shape of the mobile device 200, and the shapes of the back cover 102 and front cover 104, intended by the particular embodiment, and the raised perimeter may comprise a shape sufficient to removably attach to the outer perimeter of the back cover 102 and front cover 104. The height of the raised perimeter 130 may be any height equal to or slightly greater than the thickness of the back cover 102 and front cover 104. In this way the protective housing 126, when attached to the back cover 102 and front cover 104, may tightly encompass the back cover 102, plurality of fins 118, front cover 104, and mobile device 200 such that these components do not move relative to the protective housing 126.

The protective housing 126 may further comprise a plurality of protective housing openings 132 that may match to the features 204 of the intended mobile device 200 of the particular embodiment. By way of example, a mobile device 200 may comprise a cell phone having a camera and fingerprint reader on its back surface, neither of which a user of the cell phone would want blocked by the case on the cell phone. The plurality of protective housing openings 132, then, would comprise openings sufficient to allow a user access to these features 204 on the device.

The raised perimeter 130 of the protective housing 126 may further comprise a plurality of vents 134 through which air may flow or be flowed so as to facilitate the cooling of the mobile device 200 across the plurality of fins 118. The plurality of vents 134 may comprise a plurality of holes or openings in the sides of the protective housing 126, running through the entire thickness of the material of the protective housing 126. In one embodiment the plurality of vents 134 may comprise round openings or may comprise rectangular openings, as desired, for efficient air flow and aesthetic purposes.

In one embodiment the mobile hardware heat dissipating and protection device 100 may further comprise an integrated fan, which may be built into or housed within the protective housing 126, and which may serve to provide air flow through the plurality of vents 134. The integrated fan may be attached to the protective housing 126 or to the back cover 102, and may receive power from the mobile device 200 or an integrated power source in the mobile hardware heat dissipating and protection device. The integrated fan may comprise any fan appropriate to providing air flow while maintaining a low weight factor and small form factor such as, for example, a micro fan.

Figure 5:
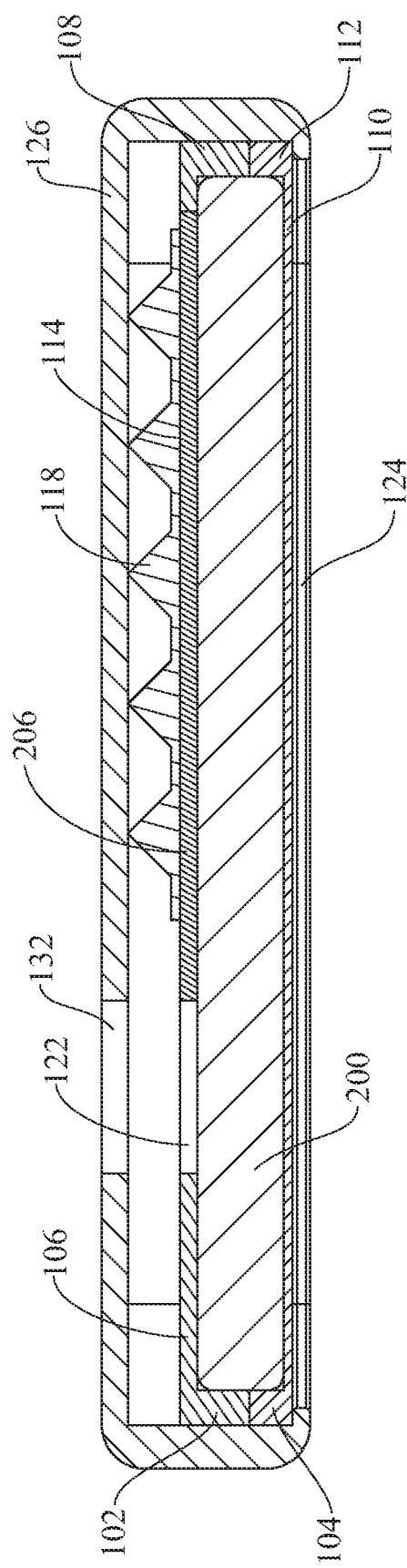
FIG. 5 illustrates a cross-sectional view of a mobile hardware heat dissipating and protection device, in accordance with aspects of the present disclosure.

The illustration of FIG. 5 illustrates a cross-sectional view of a mobile hardware heat dissipating and protection device. The back cover 102 may be removably attached to the back surface 206 of a mobile device 200, such as a smart phone or tablet, and may then be removably attached to the front cover 104, which may itself be removably attached to the front surface of a mobile device 200. The attachment of the back cover 100 to the front cover 104 may result in the interposing of the mobile device 200 between back cover 102 and the front cover 104, and the protective housing 126 may be removably attached to the outer surface of the back cover 102 and front cover 104 when installed on a mobile device 200. The heat dissipation mechanism 114 is positioned between the plurality of fins 118 and the mobile device 200, within the back cover 102.

The form factor of the protective housing 126 is such that it creates a space between itself and the back cover 102 so as to permit the location and protection of the plurality of fins 118. The space between the protective housing 126 and the back cover 102 also permits the flow of air through and around the plurality of fins 118 and into and out of the plurality of vents 134, (seen in FIG. 6), in the sides of the protective housing 126.

The screen protector 124 of the front cover 104 may abut the screen 202 of the mobile device 200 so as to provide a clear view of the display. The plurality of back cover openings 122 and plurality of protective housing openings 132 may be positioned over the features 204 of the mobile device 200 to allow a user access to these features 204 on the device. The screen protector 124, plurality of back cover openings 122, and plurality of protective housing openings 132 may vary as needed, depending on the design of the mobile device 200 in the particular embodiment.

Figure 6:
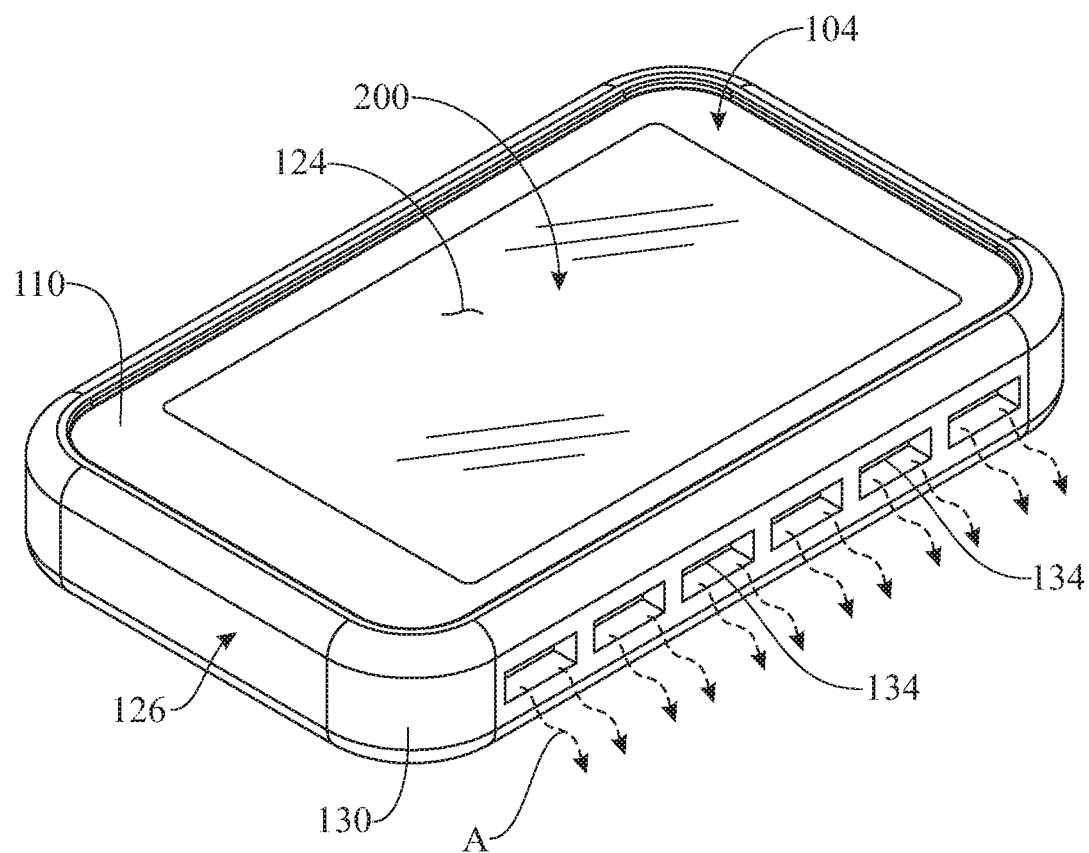
FIG. 6 illustrates top isometric perspective view of a mobile hardware heat dissipating and protection device showing heat dissipation, in accordance with aspects of the present disclosure.

The illustration of FIG. 6 illustrates a mobile hardware heat dissipating and protection device 100 showing heat dissipation. As contemplated by the present disclosure, the thermal energy created by the mobile device 200 is transferred through the heat dissipation mechanism 114 into the plurality of fins 118, where air flow around the plurality of fins 111802 permits the dissipation of heat and, thus, cooling of the mobile device 200. The flow of air around the plurality of fins 118 causes the air to be heated, and this hot air may be evacuated from the mobile hardware heat dissipating and protection device through the plurality of vents 134 in the protective housing 126, as shown by the arrows marked "A" in FIG. 6. The flow of air may be in any direction through the plurality of vents, and may be augmented by an integrated fan installed within the protective housing 126.

In one embodiment the mobile hardware heat dissipating and protection device may be substantially constructed of any suitable material or combination of materials, but typically is constructed of a resilient material or combination of materials such that the combination is resistant to crushing and damage as a result of compression, flexion, or submersion in water. As an example, and without limiting the scope of the present invention, various exemplary embodiments of the combination may be substantially constructed of one or more materials of rubber, aluminum, brass, plastic, fiberglass, carbon fiber, copper, steel, or combinations thereof. In one alternative embodiment, the protective device may be made out of an alloy such as, sterling silver.

The various components of the mobile hardware heat dissipating and protection device 100 may be substantially constructed as a single piece design, or may be constructed as multiple pieces attached to each other. The back cover 102 may comprise any appropriate rigid material or any appropriate flexible material, as desired. The front cover 104 may comprise any appropriate rigid material or any appropriate flexible material, as desired. The screen protector 124 may comprise any appropriate flexible or rigid material comprising a translucent sheet or skin through which the screen 202 of the mobile device 200 may be visualized. The protective housing 126 may comprise any appropriate rigid material or any appropriate flexible material, as desired. The back cover 102, front cover 104, and protective housing 126 may substantially comprise similar materials of construction for longevity and aesthetic consistency, as desired.

In one embodiment the mobile hardware heat dissipating and protection device may comprise a resilient material of construction that either comprises a material having antimicrobial properties or comprises a layering of antimicrobial material or coating. Antimicrobial properties comprise the characteristic of being antibacterial, biocidal, microbicidal, anti-fungal, anti-viral, or other similar characteristics, and the oligodynamic effect, which is possessed by copper, brass, silver, gold, and several other metals and alloys, is one such property. Copper and its alloys, in particular, have exceptional self-sanitizing effects. Silver also has this effect, and is less toxic to users than copper. The integration of silver nanoparticles in their metallic form into the cell phone case body, for example, may serve to facilitate this antimicrobial property.

Since many modifications, variations, and changes in detail can be made to the described preferred embodiments of the invention, it is intended that all matters in the foregoing description and shown in the accompanying drawings be interpreted as illustrative and not in a limiting sense.

Thus, the scope of the invention should be determined by the appended claims and their legal equivalents.

What is claimed is:

1. A protective and heat dissipating device, comprising:
a back cover having a flat body and a raised perimeter;
a top cover having a flat body, a raised perimeter, and a viewing pane about the flat body,
   wherein the back cover is selectively attachable to the top cover to form an interior cavity for receiving an electronic device,
a heat dissipating mechanism disposed about the back cover; and
a protective housing,
   wherein the heat dissipating mechanism comprises of a plurality of fins disposed about an exterior surface of the flat body of the back cover.

2. The protective device of claim 1, wherein the raised perimeter of the back cover is of a height that is at most equal to a thickness of the electronic device.

3. The protective device of claim 1, wherein the raised perimeter of the front cover is of a height that is at most equal to the thickness of the electronic device.

4. The protective device of claim 1, wherein the raised perimeter of the front cover and back cover are inversely related such that a combined height of the raised perimeters of both the front cover and back cover are at least equal to a thickness of the electronic device.

5. The protective device of claim 1, wherein the heat dissipating mechanism comprises a thermally conductive gel.

6. The protective device of claim 5, wherein the thermally conductive gel is disposed about an interior surface of the flat body of the back cover.

7. The protective device of claim 1, wherein the viewing pane is made out of a protective, anti-glare, anti-fingerprint, and scratch resistant material.

8. The protective device of claim 1, wherein the back cover includes at least one feature opening that allows access to a feature provided by the electronic device.

9. The protective device of claim 1, wherein the protective housing covers the back cover and a portion of the front cover.

10. The protective device of claim 1, wherein the electronic device is a mobile phone.

11. A protective and heat dissipating device, comprising:
a back cover having a flat body and a raised perimeter;
a top cover having a flat body, a raised perimeter, and a viewing pane about the flat body,
   wherein the back cover is selectively attachable to the top cover to form an interior cavity for receiving an electronic device, and
   wherein the viewing pane is made out of a protective, anti-glare, anti-fingerprint, and scratch resistant material,
a heat dissipating mechanism comprising,
   a thermally conductive gel disposed about an interior surface of the flat body of the back cover, and
   a plurality of micro fins disposed about an exterior surface of the flat body of the back cover; and
a protective housing having a flat body and a raised perimeter, the raised perimeter including a plurality of vents disposed about its opposite ends,
   wherein the protective housing covers the back cover and a portion of the front cover, and
   wherein the raised perimeter of the protective housing sits slightly above the flat body of the front cover forming a raised lip and a uniform depression.

12. A protective and heat dissipating device, comprising:
a back cover having a flat body and a raised perimeter;
a top cover having a flat body, a raised perimeter, and a viewing pane about the flat body,
   wherein the back cover is selectively attachable to the top cover to form an interior cavity for receiving an electronic device,
a heat dissipating mechanism disposed about the back cover, the heat dissipating mechanism comprising,
   a thermally conductive gel disposed about an interior surface of the flat body of the back cover, and
   a plurality of fins disposed about an exterior surface of the flat body of the back cover; and
a protective housing that covers the back cover and a portion of the top cover.

13. A protective and heat dissipating device, comprising:
a back cover having a flat body and a raised perimeter;
a top cover having a flat body, a raised perimeter, and a viewing pane about the flat body,
   wherein the back cover is selectively attachable to the top cover to form an interior cavity for receiving an electronic device,
a heat dissipating mechanism disposed about the back cover; and
a protective housing having a flat body and a raised perimeter,
   wherein the protective housing is disposed over the back cover and a portion of the front cover, and the raised perimeter of the protective housing sits slightly above the flat body of the front cover forming a raised lip and defining a uniform depression.

14. The protective device of claim 13, wherein the raised perimeter of the protective housing includes a plurality of vents at opposite ends.

15. The protective device of claim 14, wherein the flat body of the protective housing includes at least one feature opening that allows access to a feature provided by the electronic device.

* * * * *